United States Patent
Liu et al.

(10) Patent No.: US 7,954,072 B2
(45) Date of Patent: May 31, 2011

(54) MODEL IMPORT FOR ELECTRONIC DESIGN AUTOMATION

(75) Inventors: Ru-Gun Liu, Hsinchu (TW);
Chih-Ming Lai, Hsinchu (TW);
Wen-Chun Huang, Xi-Gang Xiang (TW); Boren Luo, Hsinchu (TW);
I-Chang Shin, Hsinchu (TW);
Yao-Ching Ku, Hsinchu (TW); Cliff Hou, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 915 days.

(21) Appl. No.: 11/748,604

(22) Filed: May 15, 2007

(65) Prior Publication Data

US 2007/0265725 A1    Nov. 15, 2007

Related U.S. Application Data

(60) Provisional application No. 60/800,526, filed on May 15, 2006.

(51) Int. Cl.
*G06F 17/50* (2006.01)

(52) U.S. Cl. ........... 716/54; 716/52; 430/5; 382/144

(58) Field of Classification Search ........... 716/52, 716/54; 430/5; 382/144
See application file for complete search history.

(56) References Cited

U.S. PATENT DOCUMENTS

| | | | |
|---|---|---|---|
| 5,048,800 A | 9/1991 | Miyazaki et al. | |
| 5,440,478 A | 8/1995 | Fisher et al. | |
| 5,847,965 A | 12/1998 | Cheng | |
| 5,963,881 A | 10/1999 | Kahn et al. | |
| 6,028,991 A | 2/2000 | Akashi | |
| 6,045,619 A | 4/2000 | Tai et al. | |
| 6,077,310 A | 6/2000 | Yamamoto et al. | |
| 6,223,139 B1 * | 4/2001 | Wong et al. | 703/5 |
| 6,289,257 B1 | 9/2001 | Sekine | |
| 6,408,219 B2 | 6/2002 | Lamey, Jr. et al. | |
| 6,410,351 B1 | 6/2002 | Bode et al. | |
| 6,549,864 B1 | 4/2003 | Potyrailo | |
| 6,738,859 B2 * | 5/2004 | Liebchen | 716/19 |
| 6,810,296 B2 | 10/2004 | Bode et al. | |
| 6,917,849 B1 | 7/2005 | Pasadyn et al. | |
| 6,968,253 B2 | 11/2005 | Mack et al. | |

(Continued)

OTHER PUBLICATIONS

Cobb; "Fast Optical and Process Proximity Correction Algorithms for Integrated Circuit Manufacturing"; PhD Dissertation; University of California at Berkley, 1998; pp. 1-139.*

(Continued)

*Primary Examiner* — Naum Levin
(74) *Attorney, Agent, or Firm* — Haynes and Boone, LLP

(57) ABSTRACT

Methods and systems for providing processing parameters in a secure format are disclosed. In one aspect, a method for providing semiconductor fabrication processing parameters to a design facility is disclosed. The method comprises providing a set of processing parameters of a fabrication facility; creating a model from the set of processing parameters; converting the model into a corresponding set of kernels; converting the set of kernels into a corresponding set of matrices; and communicating the set of matrices to the design facility. In another aspect, a method for providing semiconductor fabrication processing parameters is disclosed. The method comprises providing a set of processing parameters of a fabrication facility; creating a processing model from the set of processing parameters; encrypting the processing model into a format for use with a plurality of EDA tools; and communicating the encrypted processing model format to a design facility.

20 Claims, 10 Drawing Sheets

U.S. PATENT DOCUMENTS

| | | | |
|---|---|---|---|
| 6,980,873 | B2 | 12/2005 | Shen |
| 7,079,223 | B2 * | 7/2006 | Rosenbluth et al. ............ 355/67 |
| 7,144,297 | B2 | 12/2006 | Lin et al. |
| 7,245,354 | B2 * | 7/2007 | Granik ............................ 355/67 |
| 7,266,803 | B2 * | 9/2007 | Chou et al. ....................... 716/21 |
| 7,337,093 | B2 * | 2/2008 | Ramani et al. .................... 703/1 |
| 7,360,191 | B2 | 4/2008 | Chang et al. |
| 7,363,207 | B2 | 4/2008 | Kamon |
| 7,506,299 | B2 * | 3/2009 | Socha et al. .................... 716/19 |
| 7,623,220 | B2 * | 11/2009 | Granik ............................ 355/67 |
| 2004/0029299 | A1 | 2/2004 | Pasadyn et al. |
| 2004/0040001 | A1 | 2/2004 | Miller et al. |
| 2004/0093107 | A1 | 5/2004 | Good et al. |
| 2004/0181299 | A1 | 9/2004 | Yamazaki et al. |
| 2004/0265707 | A1 * | 12/2004 | Socha ............................... 430/5 |
| 2005/0007577 | A1 | 1/2005 | Engelhard et al. |
| 2005/0008227 | A1 | 1/2005 | Duan et al. |
| 2005/0021272 | A1 | 1/2005 | Jenkins et al. |
| 2005/0044514 | A1 | 2/2005 | Wu et al. |
| 2005/0076322 | A1 * | 4/2005 | Ye et al. .......................... 716/20 |
| 2005/0120328 | A1 | 6/2005 | Seltmann et al. |
| 2005/0132306 | A1 | 6/2005 | Smith et al. |
| 2005/0188338 | A1 | 8/2005 | Kroyan et al. |
| 2005/0209820 | A1 | 9/2005 | Inoue et al. |
| 2005/0288812 | A1 | 12/2005 | Cheng et al. |
| 2006/0026539 | A1 | 2/2006 | Tetelbaum et al. |
| 2006/0048010 | A1 | 3/2006 | Tai et al. |
| 2006/0111804 | A1 | 5/2006 | Lin |
| 2006/0123380 | A1 | 6/2006 | Ikeuchi |
| 2006/0190876 | A1 | 8/2006 | Yamada |
| 2006/0282189 | A1 | 12/2006 | Akisawa et al. |
| 2007/0055892 | A1 | 3/2007 | Pikus |
| 2007/0101305 | A1 | 5/2007 | Smith et al. |
| 2007/0201442 | A1 | 8/2007 | Hekmatpour et al. |
| 2007/0218176 | A1 * | 9/2007 | Adam ............................ 426/489 |
| 2007/0234246 | A1 | 10/2007 | Sinha et al. |
| 2007/0265725 | A1 | 11/2007 | Liu et al. |
| 2007/0266356 | A1 | 11/2007 | Chang et al. |
| 2007/0266362 | A1 | 11/2007 | Lai et al. |
| 2007/0277134 | A1 | 11/2007 | Zhang et al. |
| 2007/0288219 | A1 | 12/2007 | Zafar et al. |
| 2009/0070725 | A1 | 3/2009 | Yamada |
| 2009/0199151 | A1 | 8/2009 | Banerjee et al. |

OTHER PUBLICATIONS

Chappell, Jeff, "The Future is the FOUP— Company Business and Marketing", Electronic News, Jul. 17, 2000, 2 pages.

Chen, Kuan-Chou, et al., "Integrated Circuits Industry / Front-Opening Unified Pod Audo-Loading Structure", Knowledge Bridge, No. 22, Apr. 2002, 4 pages.

Ottesen, Craig, "Front Opening Pod (FOUP) Fire Protection: A General Overview", International Sematech, Nov. 5, 1999, 10 pages.

Tian, Yuxin, et al., "Impact of photolithography and Mask Variability on Interconnect Parasitics," 10 pages.

Zhou, Ying, et al., "A New Methodology for Interconnect Parasitics Extraction Considering Photo-Lithography Effects," 6 pages.

U.S. Appl. No. 12/025,933, filed Feb. 5, 2008 by Francis Ko, Chih-Wei Lai, Kewei Zuo, Henry Lo, Jean Wang, Ping-hsu Chen, Chun-Hsien Lin, and Chen-Hua yu for "Novel Methodology to Realize Automatic Virtual metrology," 23 pages.

Cheng, Y.C., et al., "Patterning Effect and Correlated Electrical Model of Post-OPC MOSFET Devices," Proceeding of SPIE vol. 6521 65210G-1 to 65210G-9, 9 pages.

Yue, H. H., et al., "Fault Detection of Plasma Etchers using Optical Emission Spectra," Aug. 2000, IEEE Transactions on Semiconductor Manufacturing, vol. 13, Issue 3, 12 pages.

Huang, Yi-Ting, et al., "Importance of Data Quality in Virtual metrology," IEEE Industrial Electronics, IECON 2006, 32nd Annual Conference, Nov. 6-10, 2006, 6 pages.

Chang, Yaw-Jen, et al., "Virtual Metrology Technique for Semiconductor Manufacturing," Neural Networks, 2006, IJCNN '06, International Joint conference Jul. 16-21, 2006, 5 pages.

Lin, Tung-Ho, et al., "A Virtual Metrology Scheme for Predicting CVD Thickness in Semiconductor Manufacturing," Robotics and Automation, ICRA Proceedings 2006, IEEE International Conference May 15-19, 2006, 6 pages.

Charles Ouyang et al., An Analytical Model of Multiple ILD Thickness Variation Induced by Interaction of Layout Pattern and CMP Process, IEEE Transactions on Semiconductor Manufacturing, Aug. 2000, 7 pages.

Raghvendra, Srinivas et al., "DFM: Linking Design and Manufacturing," Proceedings of the 18th International Conference on VLSI Design Held Jointly with 4th International Conference on Embedded Systems Design, VLSID, 2005, pp. 705-708.

Tsujikawa, Hiroyuki et al., "Power-Supply Noise Reduction with Design for Manufacturability," IEICE Trans Fundamentals, vol. E88-A, No. 12, Dec. 2005, pp. 3421-3428.

\* cited by examiner

| | 1 | 2 | 3 | 4 | 5 |
|---|---|---|---|---|---|
| 5 | 5<br>5+6i | 10<br>4+5i | 15<br>3+6i | 20<br>2+5i | 25<br>1+4i |
| 4 | 4<br>4+5i | 9<br>3+4i | 14<br>2+5i | 19<br>1+4i | 24<br>6+3i |
| 3 | 3<br>3+4i | 8<br>2+3i | 13<br>1+4i | 18<br>6+3i | 23<br>5+2i |
| 2 | 2<br>2+3i | 7<br>1+2i | 12<br>6+3i | 17<br>5+2i | 22<br>4+i |
| 1 | 1<br>1+2i | 6<br>6+i | 11<br>5+2i | 16<br>4+i | 21<br>3+6i |

802 — VERSION 0.1
804 — MASKFIELD clear
806 — MAXR 137
808 — DOMAINSIZE 2.000000e-006
810 — FORMAT spatial
812 — BiKER_NUM 20
814 — LiKER_NUM 4
816 — BiKERNEL K01 BEGIN
   1.865915e-002, 0.000000e+000
   1.100350e-002, 0.000000e+000
   <Real part>, <Image part>
   .
   .
   .
   1.865915e-002, 0.000000e+000
818 — BiKERNEL K01 END
820 — BiKERNEL K02 BEGIN
   2.529719e-002, 0.000000e+000
   4.281853e-002, 0.000000e+000
   .
   .
   .
822 — BiKERNEL K02 END
824 — LiKERNEL L01 BEGIN
   4.824418e-019, 0.000000e+000
   9.372952e-019, 0.000000e+000
   1.801744e-018, 0.000000e+000
   .
   .
   .
   4.824418e-019, 0.000000e+000
826 — LiKERNEL L01 END

BiKERNEL K01 BEGIN
 1.000e+000, 2.000e+000
 2.000e+000, 3.000e+000
 3.000e+000, 4.000e+000
 4.000e+000, 5.000e+000
 5.000e+000, 6.000e+000
 6.000e+000, 1.000e+000
 1.000e+000, 2.000e+000
 2.000e+000, 3.000e+000
 3.000e+000, 4.000e+000
 4.000e+000, 5.000e+000
 .
 .
 .
 3.000e+000, 6.000e+000
BiKERNEL K01 END

*Fig. 15*

MODEL IMPORT FOR ELECTRONIC DESIGN AUTOMATION

CROSS-REFERENCE

This application claims the benefit of U.S. Provisional Application 60/800,526 entitled "Design for Manufacturability," filed May 15, 2006, herein incorporated by reference in its entirety.

BACKGROUND

As semiconductor fabrication technologies are continually progressing to smaller feature sizes such as 65 nanometers, 45 nanometers, and below, simply scaling down similar designs used at the larger feature sizes often results in hot spots or problem areas in the device. Hot spots in this context refer to characteristics of the device that prevent the device from performing as desired. Examples of hot spots include pinching, bridging, dishing, erosion, RC delay, metal line thickness variations, Cu residue, and other characteristics that affect the desired device performance. These hot spots can be due to the circuit design and/or the process controls. Efficient and cost-effective systems and methods for detecting and correcting hot spots are needed. Although existing devices and methods have been generally adequate for their intended purposes, they have not been entirely satisfactory in all respects.

BRIEF DESCRIPTION OF THE DRAWINGS

FIG. 10A is a 2-D matrix representation of a kernel according to one embodiment of the present disclosure.

FIG. 10B is a 2-D matrix representation of a kernel according similar to FIG. 10A, but showing an alternative embodiment of the present disclosure.

FIG. 14 is a file format for importing a layout model for use with an EDA tool according to one aspect of the present disclosure.

FIG. 15 is a 1-D representation of a kernel imported using a file format similar to that described with respect to FIG. 14.

DETAILED DESCRIPTION

Figure 1:
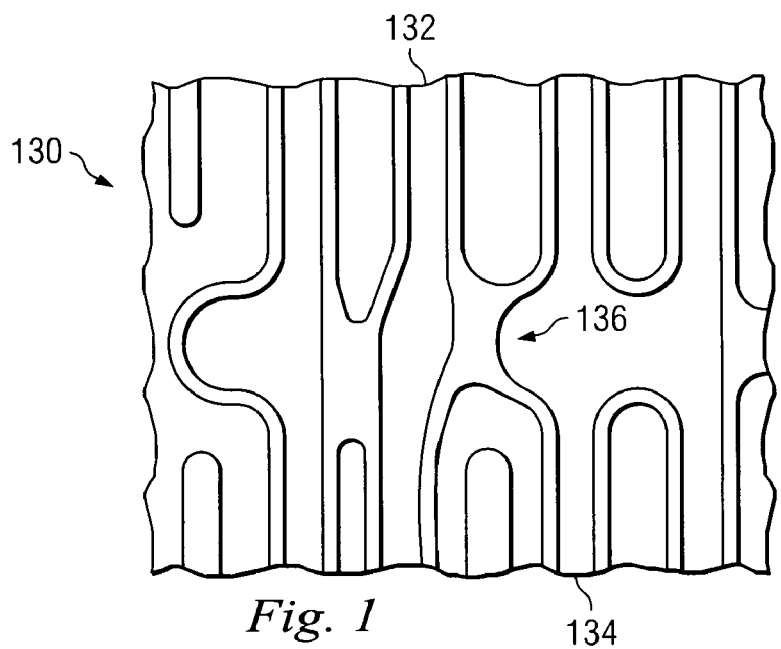
FIG. 1 is a simulation image of a top-down view of semiconductor wafer illustrating a bridging effect.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

It is understood that the following disclosure provides many different embodiments, or examples, capable of implementing different features. Specific examples of components and arrangements are described below to simplify and thus clarify the present disclosure. These are, of course, merely examples and are not intended to be limiting. In many instances, the features of one embodiment may be combined with the features of other embodiments. In addition, the present disclosure may repeat reference numerals and/or letters in the various exemplary embodiments. This repetition is for the purpose of simplicity and clarity and does not in itself dictate a relationship between the various embodiments and/or configurations discussed.

As semiconductor fabrication technologies are continually progressing to smaller feature sizes such as 65 nanometers, 45 nanometers, and below, scaling down similar designs used at the larger feature sizes often results in hot spots or problem areas in the device. Hot spots in this context refer to characteristics of the device that prevent the device from performing as desired. Examples of hot spots include pinching, bridging, dishing, erosion, RC delay, metal line thickness variations, Cu residue, and other characteristics that affect the desired device performance. These hot spots can be due to the circuit design and/or the process controls. As feature sizes have been scaled down it has become more important to check the device layout for potential hot spots at the design stage. This is due to the increased sensitivity of the wafers to processing parameters that can result in hot spots. Thus, it can be advantageous to recognize these potential hot spots at the design stage and modified the device layout accordingly. The hot spot check may be performed by a design rule check ("DRC") and/or a layout pattern check ("LPC"). However, in some embodiments, the effectiveness of DRC may be limited due to the complexity of the design layout and, therefore, the use of LPC may be preferred. For example, in some embodiments a particular layout may satisfy a DRC, but the LPC may identify a hot spot or other weakness in the design that will result from the processing steps. In some embodiments, the LPC simulates one or more of the processing steps of a semiconductor foundry. In that regard, the parameters of the LPC may be directly based on the various processing parameters of the different stages of processing, the tools used in the processing, and/or other aspects of the manufacturing process. In one embodiment of the current disclosure, a universal model LPC is provided by a semiconductor foundry such that the simulated processing parameters of the LPC are consistent with the actual processing parameters of the foundry. In some embodiments, the universal model LPC may be encrypted or otherwise formatted to prevent reverse engineering of the foundry's processing parameters.

LPC may be used to inspect a design layout for processing weak spots and/or hot spots that may result in yield lost due to patterning processes, such as lithography and etching processes. The LPC may take into account such factors as aerial image contrast, depth of focus ("DOF"), mask error sensitivity ("MEEF"), and/or other factors. In some embodiments the LPC is used to simulate the effects of a photolithography process on the layout. In some embodiments the LPC is used to monitor and/or correct any optical proximity effects of the layout.

An electronic design automation (EDA) tool may include a LPC to simulate the effects of the processing steps of a particular semiconductor foundry. However, there are numerous EDA tool vendors and often each EDA tool vendor has a different LPC for the particular foundry. This can result in the same design layout having different LPC results depending on the EDA tool vendor and the LPC used to analyze the layout. Use of LPC at the design stage, however, should replicate the processing steps of the foundry such that an accurate representation of the effects of processing on the layout can be obtained. Thus, LPCs should be consistent across different EDA tools for the same design layout regardless of the vendor or LPC. The universal model LPC of the present disclosure may ensure that LPCs across different EDA tools and vendors are consistent with the actual processing parameters of the foundry and consistent with one another for a particular design layout.

Figure 2:
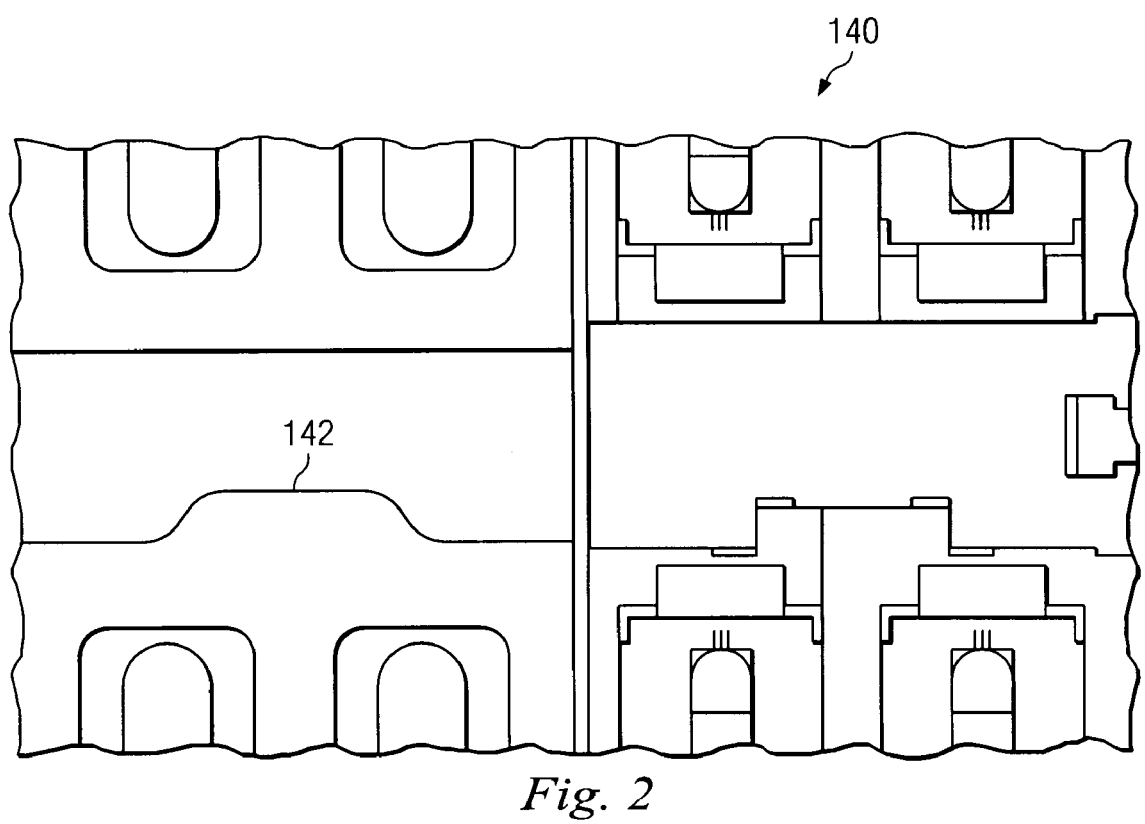
FIG. 2 is a simulation/SEM image of a top-down view of a semiconductor wafer illustrating a bridging effect.

FIGS. 1 and 2 are top-down views of two examples of bridging effects in a semiconductor wafer. In FIG. 1, a semiconductor device 130 includes a poly line 132 and a poly line 134. The device 130 exhibits a bridging effect 136 between the poly lines 132 and 134. In FIG. 2, a semiconductor device 140 exhibits a line-end bridging effect 142. The bridging effects 136 and 142 may be caused by numerous factors including, but not limited to layout design, processing controls, inadequate line spacing, dishing, erosion, metal line thickness variations, and/or the presence of Cu residue.

Figure 3:
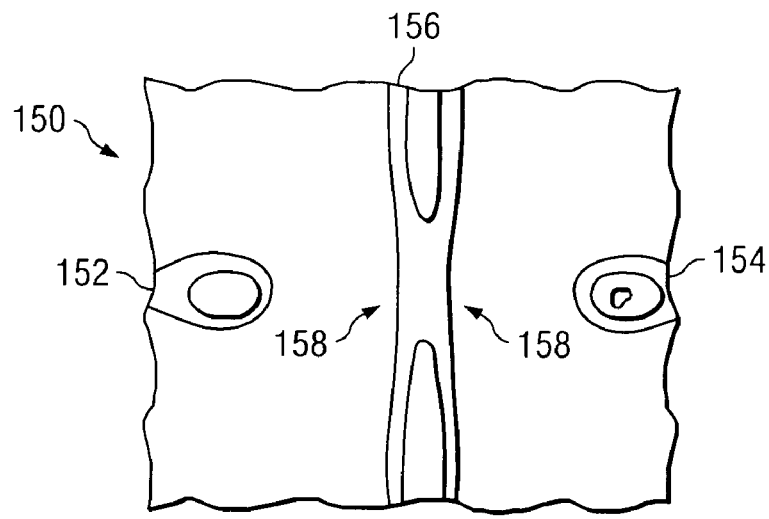
FIG. 3 is a simulation image of a top-down view of a semiconductor wafer illustrating a pinching effect.
Figure 4:
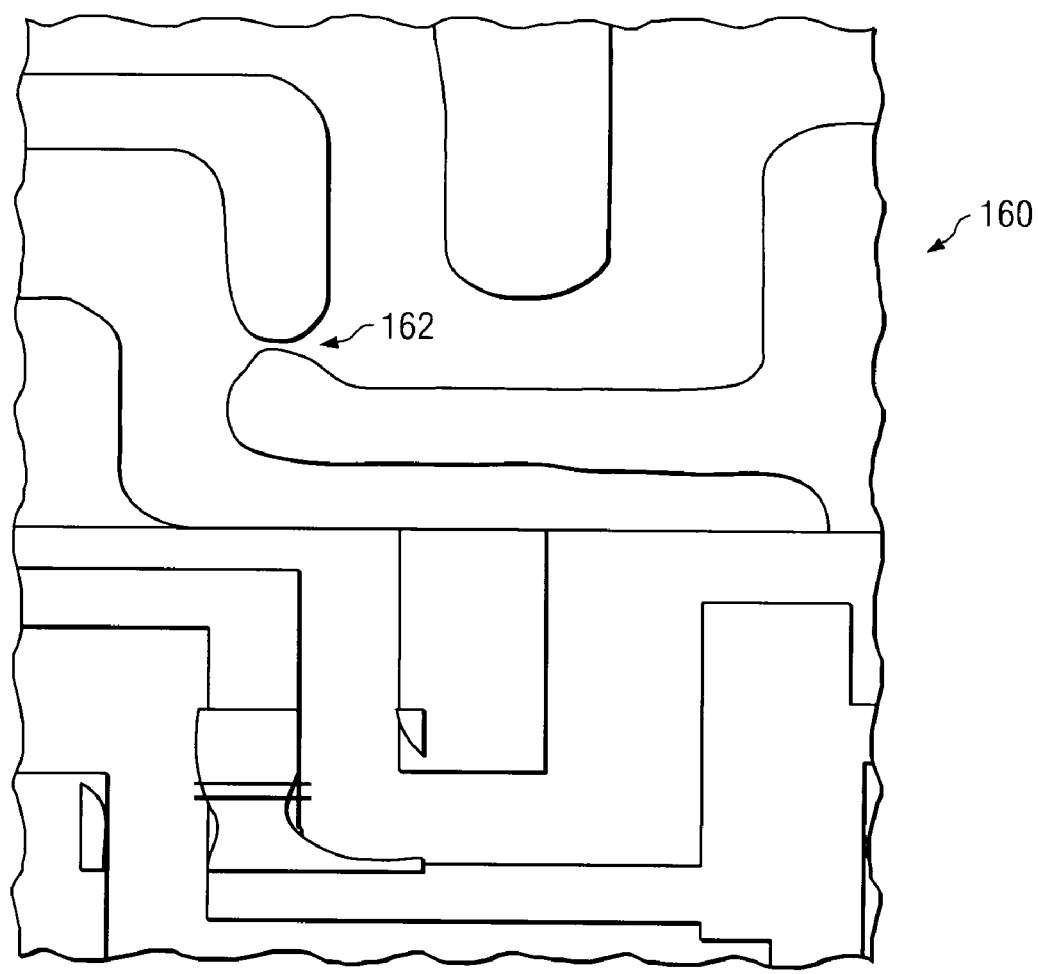
FIG. 4 is a simulation/SEM image of a top-down view of a semiconductor wafer illustrating a pinching effect.

FIGS. 3 and 4 are top-down views of two examples of pinching effects in a semiconductor wafer. In FIG. 3, a semiconductor device 150 includes metal lines 152 and 154 on either side of a metal line 156. The device 150 exhibits a pinching effect 158 along the metal line 156 between the metal lines 152 and 154. In FIG. 4, a semiconductor device 160 exhibits a pinching effect 162. The pinching effects 158 and 162 may be caused by numerous factors including, but not limited to layout design, processing controls, inadequate line spacing, dishing, erosion, metal line thickness variations, and/or the presence of Cu residue.

The semiconductor devices 130, 140, 150, and 160 may also include electric circuits and a semiconductor substrate. The electric circuits may include metal oxide semiconductor filed effect transistors (MOSFET), bipolar transistors, diodes, memory cells, resistors, capacitors, inductors, high voltage transistors, sensors, or combinations thereof. The semiconductor substrate may comprise an elementary semiconductor (such as crystal silicon, polycrystalline silicon, amorphous silicon and germanium), a compound semiconductor (such as silicon carbide and gallium arsenic), an alloy semiconductor (such as silicon germanium, gallium arsenide phosphide, aluminum indium arsenide, aluminum gallium arsenide and gallium indium phosphide) and/or combinations thereof. The semiconductor substrate may be a semiconductor on insulator (SOI), having a buried oxide (BOX) structure. In other examples, the compound semiconductor substrate may include a multiple silicon structure, or the silicon substrate may include a multilayer compound semiconductor structure, or the semiconductor substrate may include the conducting polymer materials.

In some embodiments, the present disclosure is directed towards a system and method for identifying and correcting hot spots of a semiconductor device, including hot spots caused by processing parameters of a semiconductor foundry. In particular, in some embodiments the system and method are adapted to reduce the cost and time required to produce a semiconductor device with the desired properties by identifying and correcting hot spots during the design and simulation phases, rather than after wafer processing. Some embodiments of the system and method are for use in design for manufacture (DFM) applications. Further, in some embodiments the methods of the present disclosure are performed by a router system.

Figure 5:
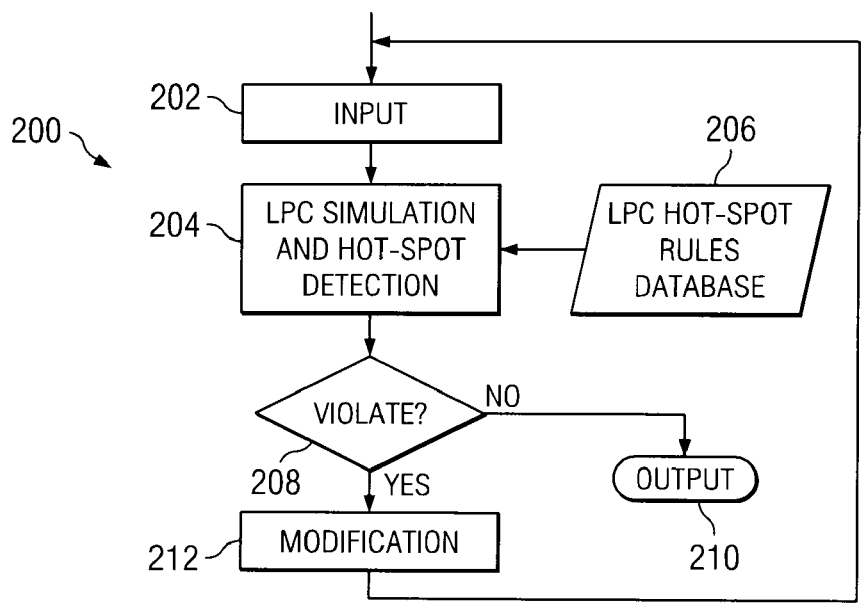
FIG. 5 is a block diagram of an embodiment of a method according to one aspect of the present disclosure for detecting and correcting hot spots of a semiconductor device.

FIG. 5 is a block diagram of an embodiment of a method 200 according to one aspect of the present disclosure for detecting and correcting hot spots of a semiconductor device. The method 200 begins with step 202 in which an input file is provided. The input file is a circuit layout or chip design and in some embodiments is retrieved from a design database. The circuit layout is provided in a computer aided design format, such as GDS II or OASIS formats. Typically, the circuit layout includes a plurality of metal layers. Each metal layer includes metal interconnects disposed in a dielectric layer. The systems and methods described herein may be used on a single layer, a plurality of layers, and/or all of the layers of a chip design. In addition, the methods described herein may be used for detecting hot spots due to the interaction between the layers and/or the processes used to manufacture the device.

The method 200 continues with step 204 in which an LPC simulation and hot spot detection are performed on the input file. The LPC simulation may be based on an LPC model. The LPC model, in turn, may be based on the actual processing parameters of a semiconductor foundry. Additional details of one example of an LPC model will be described below in greater detail. In general, the LPC simulation will simulate the processing of the device based on the device layout to create a simulated manufactured device. It is understood that the simulated manufactured device may be all or a portion of the device layout. After LPC simulation, the step 204 continues with the simulated manufactured device being subjected to hot spot detection. In the current embodiment, the hot spot detector is a software tool that determines whether the simulated manufactured device complies with a set of hot spot rules. The hot spot detector compares the parameters of the simulated manufactured device with a plurality of hot spot rules and/or specifications from a hot spot rule database 206. The hot spot detector may compare the simulated manufactured device as a whole and/or compare individual regions of the device one at a time until all regions have been compared to the hot spot rules/specifications. For the sake of example, one such rule is a minimum density rule for interconnects in the metal layer. Each region of the metal layer has a local density associated with it. The local density for a given region is the total area of the interconnects located in the region divided by the total area of that region. The minimum density rule requires that each region have a local density equal to or greater than a minimum density value. Thus, the hot spot detector compares the local density of each region with the minimum density value to determine compliance with the rule. Several other exemplary rules will be discussed below, but by no means provide an exhaustive list of the possible hot spot rules.

It is understood that use of the term hot spot detector is intended to include software applications that can be implemented by various programming languages to determine the existence of hot spots within a particular pattern layout based on a set of hot spot rules. It is also understood that the hot spot rules may be stored in database accessible by the hot spot detector and/or may be part of the hot spot detector program itself. The hot spot rules may be organized based on processing type, layout designs, feature sizes, and/or other appropriate groupings. In some embodiments, the hot spot rules are predefined. Further, in some embodiments the hot spot rules are definable and/or additional hot spot rules can be added to and/or removed from the set of hot spot rules.

The method 200 continues with step 208 in which the hot spot detector determines whether the simulated manufactured device violates any of the plurality of hot spot rules. Continuing the example of the minimum density rule from above, if the hot spot detector determines that the local density of each region of the simulated manufactured device satisfies the minimum density value and all other hot spot rules, then the method 200 continues to step 210 in which an output file is output by the system. Where the design layout does not result in any hot spots during the LPC simulation, the output file may be substantially similar to the input file. That is, the circuit layout will satisfy the hot spot rules and, therefore, may be unchanged. In that manner, the output file is optimized for device manufacture as it does not violate any of the hot spot rules. In some embodiments, the output file may be subjected to further model-based testing, rule-based testing, and/or otherwise modified or tested to further improve the design and/or layout of the device before the manufacturing phase.

On the other hand, if the hot spot detector determines that the local density of a region of the input file violates the minimum density value, then the method 200 continues to step 212 in which the input file is modified in an attempt to avoid violation of the minimum density value and/or any of the other hot spot rules. In some embodiments, the modification is based on a set of guidance parameters and/or rules based on the hot spot rule that was violated. The suggested modifications based on the guidance parameters may be made to the input file by a computer system or program and/or directly by a user. When the modifications are made by a user, the user may manually direct the changes through a computer system/program. Where the modifications are made by a computer system/program, the guidance parameters may be stored in database accessible by computer system/program. Similarly, where the modifications are made by a user, the guidance parameters may be stored in human intelligible form accessible by user. In some embodiments, the system will suggest a modified device layout based on the guidance parameters, which the user may then make additional changes to in an effort to achieve the optimum layout design.

After the modifications have been made, then the method 200 continues again with step 202 at which a second input file is provided to the system based on the guidance parameters. In the current embodiment, the second input file is a modified version of the original circuit layout with changes directed to eliminating hot spots detected in the LPC simulation. Again, the input file is a circuit layout or chip design and in some embodiments is retrieved from a design database. The circuit layout is provided in a computer aided design format, such as GDS II or OASIS formats. In some embodiments, the circuit layout is generated by a virtual process simulator, such as a VCMP or other process simulation tool. After the modified input file is provided at step 202, the method 200 continues through steps 204, 208, and 212 as described above. This iterative process continues until the input file does not violate any of the hot spot rules, at which point the method continues with step 210 where an output file is output by the system as described above. Again, the output file is optimized for device manufacture as the device layout of the output file does not violate any of the hot spot rules. Also, in some embodiments the output file may be subjected to further model-based testing, rule-based testing, and/or otherwise modified or tested to further improve the design and/or layout of the device before the manufacturing phase.

In some embodiments, the present disclosure is directed towards a system and method for calibrating a hot spot detection and correction system. For example, systems and methods for identifying and correcting hot spots of a semiconductor device are disclosed. In particular, these system and method are adapted to reduce the cost and time required to produce a semiconductor device with the desired properties by identifying and correcting hot spots during the design and simulation phases, rather than after wafer processing. Some embodiments of the system and method are for use in design for manufacture (DFM) applications. However, if the systems and methods are not properly calibrated, then they will not provide the accurate and/or precise data necessary to identify and correct the hot spots. That is, if the LPC simulation and subsequent hot spot detection rules do not correlate with the actual processing parameters of the semiconductor foundry, then the LPC simulation and hot spot detection is of little benefit.

Figure 6:
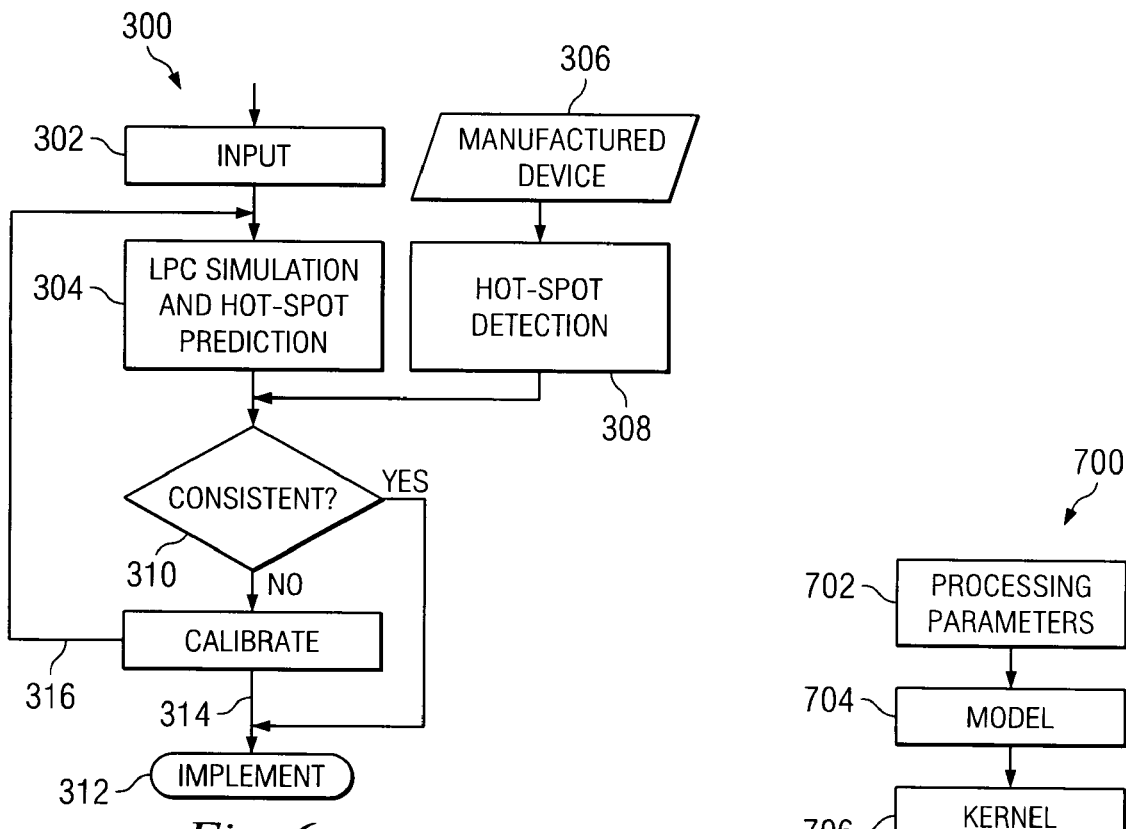
FIG. 6 is a block diagram of an embodiment of a method according to one aspect of the present disclosure for calibrating a system for detecting and correcting hot spots of a semiconductor device.

FIG. 6 is a block diagram of an embodiment of a method 300 according to one aspect of the present disclosure for calibrating a system for detecting and correcting hot spots of a semiconductor device. The method 300 begins with step 302 in which an input file is provided. The input file is a circuit layout or chip design and in some embodiments is retrieved from a design database. The circuit layout is provided in a computer aided design format, such as GDS II format.

The method 300 continues with step 304 in which an LPC simulation and hot spot detection are performed on the input file. The LPC simulation may be based on an LPC model. The LPC model, in turn, may be based on the actual processing parameters of a semiconductor foundry. Additional details of one example of an LPC model will be described below in greater detail. In general, the LPC simulation will simulate the processing of the device based on the device layout to create a simulated manufactured device. It is understood that the simulated manufactured device may be all or a portion of the device layout. After LPC simulation, the step 204 continues with the simulated manufactured device being subjected to hot spot detection. In the current embodiment, the hot spot detector is a software tool that determines whether the simulated manufactured device complies with a set of hot spot rules. The hot spot detector compares the parameters of the simulated manufactured device with a plurality of hot spot rules and/or specifications from a hot spot rule database 206. The hot spot detector may compare the simulated manufactured device as a whole and/or compare individual regions of the device one at a time until all regions have been compared to the hot spot rules/specifications. For the sake of example, one such physical parameter is minimum line spacing. Inadequate line spacing can result in hot spots such as pinching, bridging, and/or other problems. An example of another hot spot parameter is the RC characteristics of the simulated manufactured device. Any number of other hot spot parameters may be used as would be apparent to one skilled in the art. While several exemplary rules have been and will be discussed herein, these examples by no means provide an exhaustive list of the possible hot spot rules and parameters that may be utilized.

The method 300 continues with step 306 in which an actual device is manufactured according to the design layout of the input file. The device may be manufactured as test wafer, a production wafer, formed on the streets of a wafer, or otherwise manufactured. In some embodiments, the device is manufactured on the production lines and/or processing lines that the devices will be manufactured on. The method continues with step 308 in which the manufactured device is subjected to a hot spot analysis to detect hot spots on the device. Various types of analysis may be utilized in order to detect hot spots including, but not limited to, electron microscopy, scanning electron microscopy (SEM), scanning tunneling microscopy (STM), transmission electron microscopy (TEM), atomic force microscopy (AFM), other methods, and combinations thereof.

The method continues at step 310 where the hot spot detection of the simulated manufactured device is compared to the hot spot detection of the actual device to determine whether the LPC simulation and hot spot detection are consistent with the actual processing. If the LPC simulation and the hot spot detection are consistent with the hot spot detection of the actual device, then the method continues at step 312 with implementation of the LPC simulation and hot spot detection. That is, if the LPC simulation and hot spot detection are consistent with the actual results of the processing techniques, then the system may be used for detecting and correcting hot spots in circuit design layouts. However, if the LPC simulation and hot spot prediction are inconsistent with the hot spot detection of the actual device, then the method continues at steps 314, 316 with calibration of the LPC model and/or hot spot detector.

Step 314 represents a first method of calibrating the LPC simulation and hot spot detection. In step 314 the parameters of the LPC model and/or the rules/logic of the hot spot detection are adjusted so as to match the manufactured layout and hot spots of the manufactured device. In some embodiments, a plurality of circuit layouts may be simulated and manufactured to compare the accuracy of the LPC simulation to the resulting manufactured devices. In that regard, a series calibration circuit layouts or other test circuits may be used. The parameters of the LPC model may be adjusted such that the LPC simulation substantially matches the resultant manufactured device. Similarly, a plurality hot spot parameters may be analyzed in an effort to calibrate the hot spot detector in this manner. In that regard, a calibration circuit layout or other test circuit with a plurality of known hot spots may be used to calibrate the hot spot detector. Again, the hot spot rules or specifications may be modified such that the hot spot detection and the LPC simulation substantially match the resultant manufactured devices. After calibration of the hot spot detector, the method 300 continues at step 312 with the implementation of the modified LPC model and/or modified hot spot detection rules.

Step 316 represents an alternative method of calibrating the hot spot detector. Step 316 is similar to step 314 in that the parameters of the LPC model and/or the hot spot detection rules/logic are modified so as to match the manufactured device. However, after calibration the method continues at step 304 where an LPC simulation and hot spot detection are performed on the input file. Then the method 300 continues at step 310 where the hot spot detection of the simulated manufactured device is compared to the hot spot detection of the actual device to determine whether the LPC simulation and hot spot detection are consistent with the actual processing. In that regard, a new device may be manufactured for comparison or the device manufactured during the first comparison may be utilized again. If the LPC simulation and the hot spot detection are consistent with the hot spot detection of the actual device, then the method continues at step 312 with implementation of the LPC simulation and hot spot detection. However, if the LPC simulation and hot spot prediction are inconsistent with the hot spot detection of the actual device, then the method continues at steps 314, 316 with calibration of the LPC model and/or hot spot detector. This process can be iterated until the LPC simulation and the hot spot detection are appropriately calibrated to be consistent with the manufactured devices. After appropriate calibration, then the method 300 continues at step 312 with the implementation of the modified LPC model and/or modified hot spot detection rules.

In some embodiments, the present disclosure is directed towards a system and method for implementing a model for electronic design automation (EDA) tools. The model of the present disclosure may be useful in many stages of the design and fabrication process. In some embodiments, the model is adapted for use in a DFM application. In some embodiments, the model is utilized to export the processing parameters of a fabrication facility to a design facility. In that regard, the fabrication facility and the design facility may simply be different areas within a single location and/or company or, as is often the case, may be at different physical locations and/or at different companies. In some embodiments, the model is adapted for use in LPC simulations and/or hot spot detection and correction. In that regard, typically different model formats are required for each vendor and/or each EDA tool. Time and effort must be spent developing specific formats for each vendor and/or tool. Further, the hot spot detection definitions, suggested modifications, and auto-fixing parameters must also correspond to the specifications for each vendor, tool, and/or the interaction between various vendors and/or tools. Often time and effort must be spent tailoring these features. In some embodiments, the present disclosure provides a model that may be used by multiple vendors and/or tools. In some embodiments, the model allows for a single set of hot spot definitions for each type of EDA tool. In some embodiments, the model allows for a database of suggested modifications based on the hot spot definitions for each type of EDA tool. In some embodiments, the model allows for unified auto-fixing parameters that can be applied to multiple vendors and/or tools.

Figure 7:
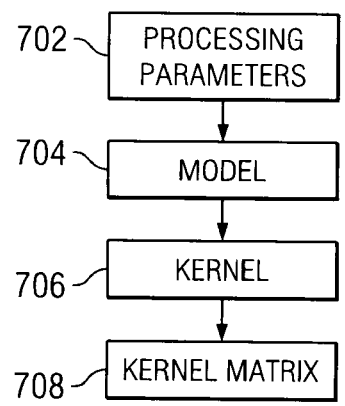
FIG. 7 is a block diagram of an embodiment of a method according to one aspect of the present disclosure for creating a model matrix from a set of processing parameters.

Referring now to FIG. 7, shown therein is a block diagram of an embodiment of a method 700 according to one aspect of the present disclosure for creating a model matrix from a set of processing parameters. In particular, the method 700 begins at step 702 where a set of processing parameters are provided. In some embodiments, the set of processing parameters are the processing parameters of a semiconductor fabrication processing facility. In one particular embodiment, the processing parameters are for a lithography process. After the processing parameters have been provided, the method 700 continues at step 704 with the creation of a model based on the processing parameters. In this regard, the model may be created using a computer system. Thus, the model may be virtual and/or temporary. In some embodiments, the model is kept in a computer readable memory unit for future access. In that regard, in some embodiments the model may be stored in a database. In some embodiments, the model is a universal model in that it may be used by a plurality of vendors and/or EDA tools. In some embodiments, the model is created by using known modeling techniques.

After the model has been created, the method 700 continues at step 706 with the conversion of the model into kernel form. The model may be converted into any number of kernels. In some embodiments, the model is converted into a single kernel. In other embodiments, the model is converted into two or more kernels. Each of the plurality of kernels may correspond to different aspects of the processing model and/or the aspects may overlap between kernels. Where the model is converted into two or more kernels, each of the kernels may be configured for individual use and/or configured for combined use with the other kernels. In some embodiments, the kernels are two dimensional. In other embodiments, the kernals are three or more dimensional Lithography is a partial coherent light system, which can be described by a Hopkins equation. In order to save computing time, the illumination source and projection part of the Hopkins equation can be written as a transmission cross-coefficient ("TCC"). Moreover, the TCC can be decomposed into several bilinear kernels. The bilinear kernel operation with the mask is squared after convolution with mask. The physical meaning of the equation is that the partial coherent light can be seen as the sum of the coherent system. The linear kernel can be seen as the synthetic compensation of CAR effect, loading effect, and scattering effect, which are not included in Hopkins equation. The linear kernel operation is convoluted with mask. In one embodiment, the following equation may be used to calculate image intensity from a set of kernels:

$$I(x, y) = \sum_i |BK_i(x, y) \otimes M(x, y)|^2 + \sum_j LK_j(x, y) \otimes M_b(x, y).$$

Figure 8:
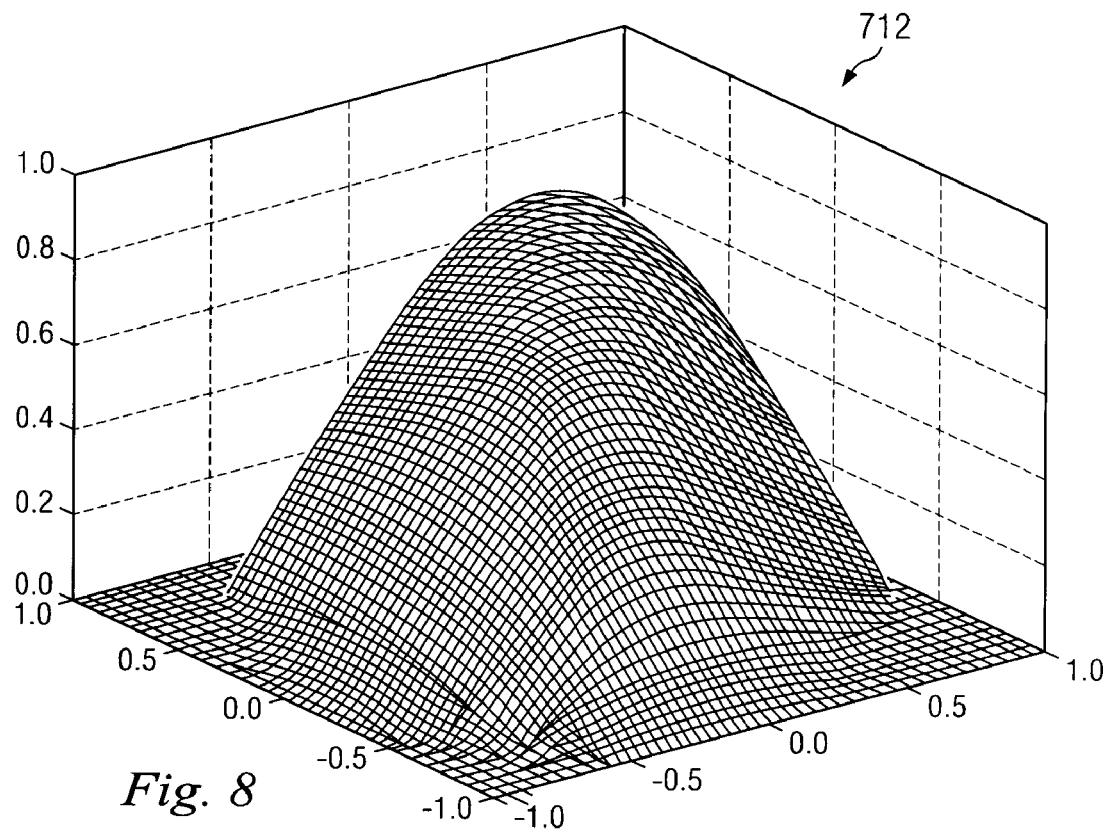
FIG. 8 is an intensity image according to one embodiment of the present disclosure.

In the equation, I(x,y) is the intensity at position (x,y); $BK_i$ is a bilinear kernel that in some embodiments is obtained from TCC decomposition; $LK_j$ is a linear kernel; M(x,y) is the mask pattern, which can be binary and PSM; $M_b(x,y)$ is the binary mask with the same or similar pattern as M(x,y), but not necessarily the same phase setting; ⊗stands for convolution, and I(x,y) is the intensity. FIG. 8 is a visual representation 712 of an intensity calculation according to such an embodiment.

Figures 10A, 10B:
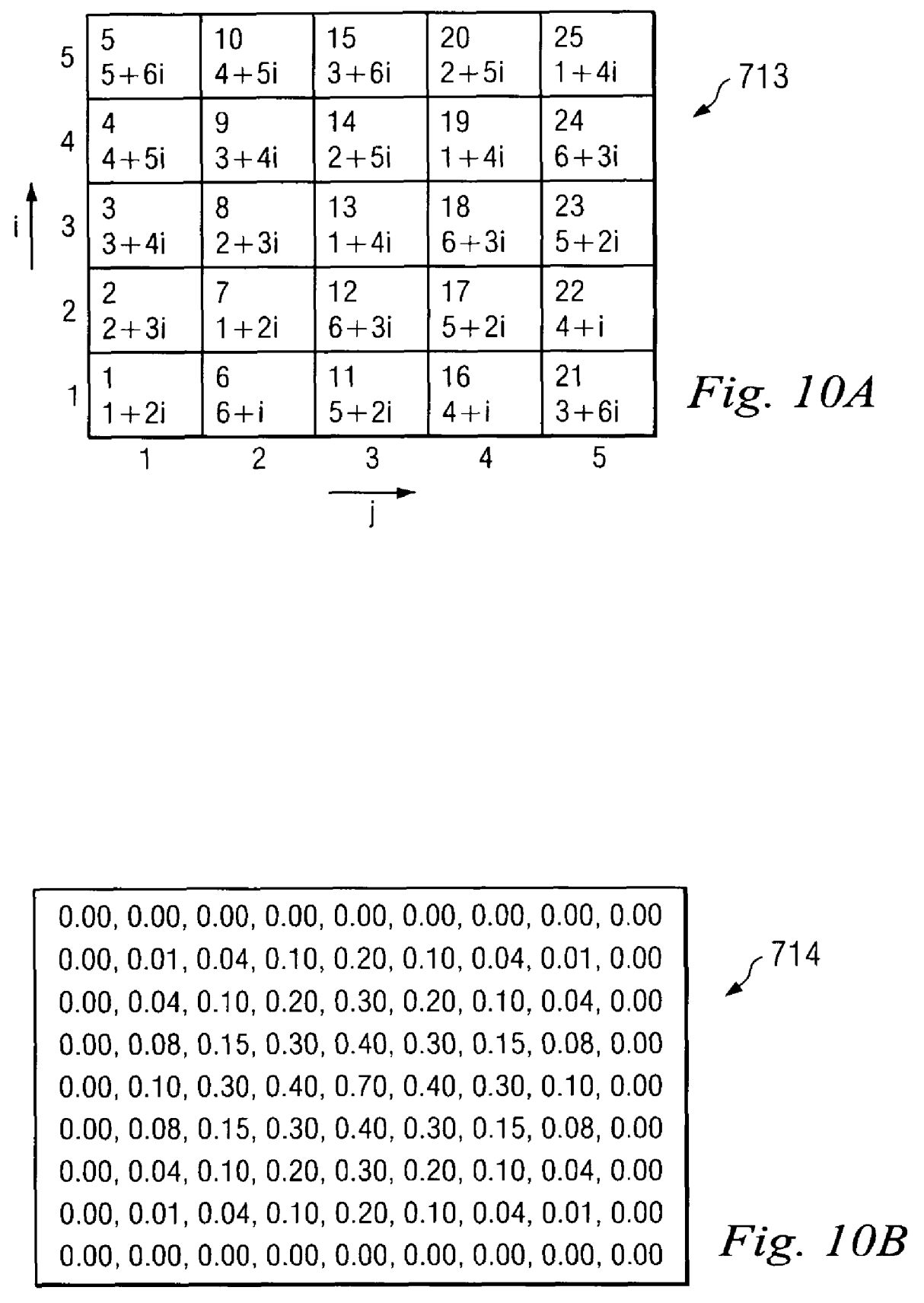

Referring again to FIG. 7, after the model has been converted into kernel form, the method 700 continues with step 708 in which the kernel(s) is (are) converted into a matrix format. In some embodiments, the kernels are two dimensional and the resulting matrix and/or matrices are two dimensional. For example, FIGS. 10A and 10B are examples of matrices 713, 714 based on processing model kernels according to one embodiment of the present disclosure. Referring again to FIG. 7, in some embodiments the matrix format of the model is then be exported to a design facility. In some embodiments, additional information and/or processing parameters are exported along with the matrix. In some embodiments, the kernels and any relevant coefficients for related calculations are provided to the user/design facility. The design facility may then utilize the processing parameters imbedded in the matrix to design devices based on the specific processing parameters of the fabrication facility from which the matrix model is based. Further, in some embodiments the matrix is adapted to interface with a plurality of EDA tools including tools made by different vendors. In this manner, the matrix model can serve is a universal model layout for the processing parameters of the fabrication facility.

In some embodiments, the matrix cannot be reversed to extract the processing conditions. By converting the model into a kernel-based matrix format in such embodiments, the fabrication facility is able to export the processing conditions for use by the design facilities without releasing the details of any underlying proprietary or other processing details to the design facility. Thus, the fabrication facility can provide its processing conditions to the designers in a manner sufficient to support development of new device designs consistent with the processing conditions, but with less fear of proprietary processing techniques being misappropriated.

Figure 9:
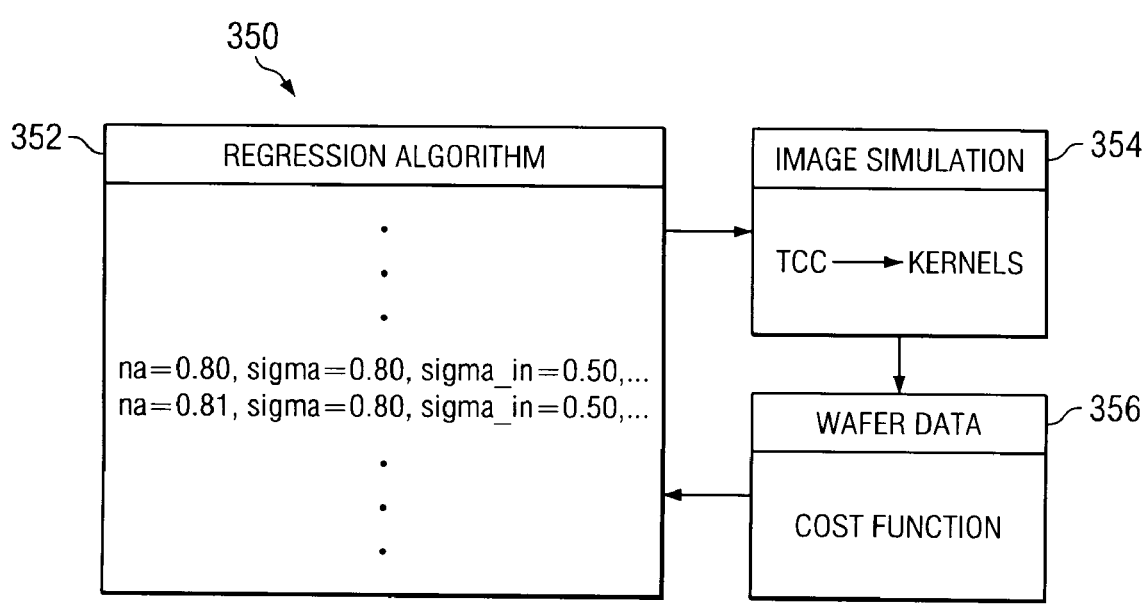
FIG. 9 is a block diagram of an embodiment of a method according to one aspect of the present disclosure for creating a model of a manufacturing process.

FIG. 9 is a block diagram of an embodiment of a method 350 for creating a model of a manufacturing process according to one aspect of the present disclosure. The method 350 begins with step 352 where a regression algorithm selects the processing parameters for input into a TCC. The regression algorithm may select a single processing parameter from a plurality of processing parameters, all of the plurality of processing parameters, and/or select groups of processing parameters. The method 350 continues at step 354 where the TCC is decomposed into a plurality of kernels for image simulation. In particular, the kernels may be convoluted with optical proximity effect ("OPE") patterns to obtain an image simulation. The OPE patterns may be typical patterns for a specific generation and/or a specific layer for a device layout. The method 250 continues at step 356 where the simulate image from step 354 is compared with wafer data to determine whether the simulation is accurate. In some embodiments, the comparison may be performed by a regression algorithm. Based on the comparison between the simulation and the wafer data for a particular generation or layer, the parameter value is selected. In some embodiments, the parameter values for the model are optimized using a cost-function analysis. In particular, cost-function may be utilized with respect to data fidelity and the critical pattern and recipes concerns of processing. This method 350 continues for each processing parameter to be included in the model. In that regard, in some embodiments the different processing parameters may each form a model. Then the models for each of the processing parameters may be combined into a general model. In this manner, various combinations of processing parameters may be combined into a single model. On the other hand, in some embodiments all of the processing parameters are combined into a single model initially. Thus, in some embodiments the steps 352, 354, and 356 iterate for each processing parameter until all of the desired processing parameters have been input into the model.

Figure 11:
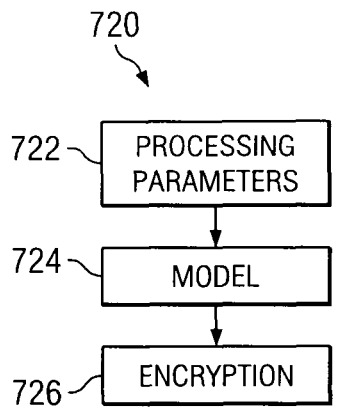
FIG. 11 is a block diagram of an embodiment of a method according to one aspect of the present disclosure for creating a encrypted model from a set of processing parameters.

Referring now to FIG. 11, shown therein is a block diagram of an embodiment of a method 720 according to one aspect of the present disclosure for creating a encrypted model from a set of processing parameters. In particular, the method 720 is a generalized form of the method 700 described above. The method 720 begins at step 722 where a set of processing parameters are provided. In some embodiments, the set of processing parameters are the processing parameters of a semiconductor fabrication process. After the processing parameters have been provided, the method 720 continues at step 724 with the creation of a model based on the processing parameters. In this regard, the model may be created using a computer system. Thus, the model may be virtual and/or temporary. In some embodiments, the model is kept in a computer readable memory unit for future access. In that regard, in some embodiments the model may be stored in a database. In some embodiments, the model is a universal model in that it may be used by a plurality of vendors and/or EDA tools. After the model has been created, the method 720 continues at step 726 with the encryption of the model. In one embodiment, the model is encrypted using the kernel and matrix technique described above with respect to method 700. However, numerous other known encryption techniques may be used. In some embodiments, the encryption technique chosen is adapted to provide the processing parameters of the model to a user, but in a manner that limits the user's ability to reverse engineer the encryption and model to derive the underlying processing conditions.

Figure 12:
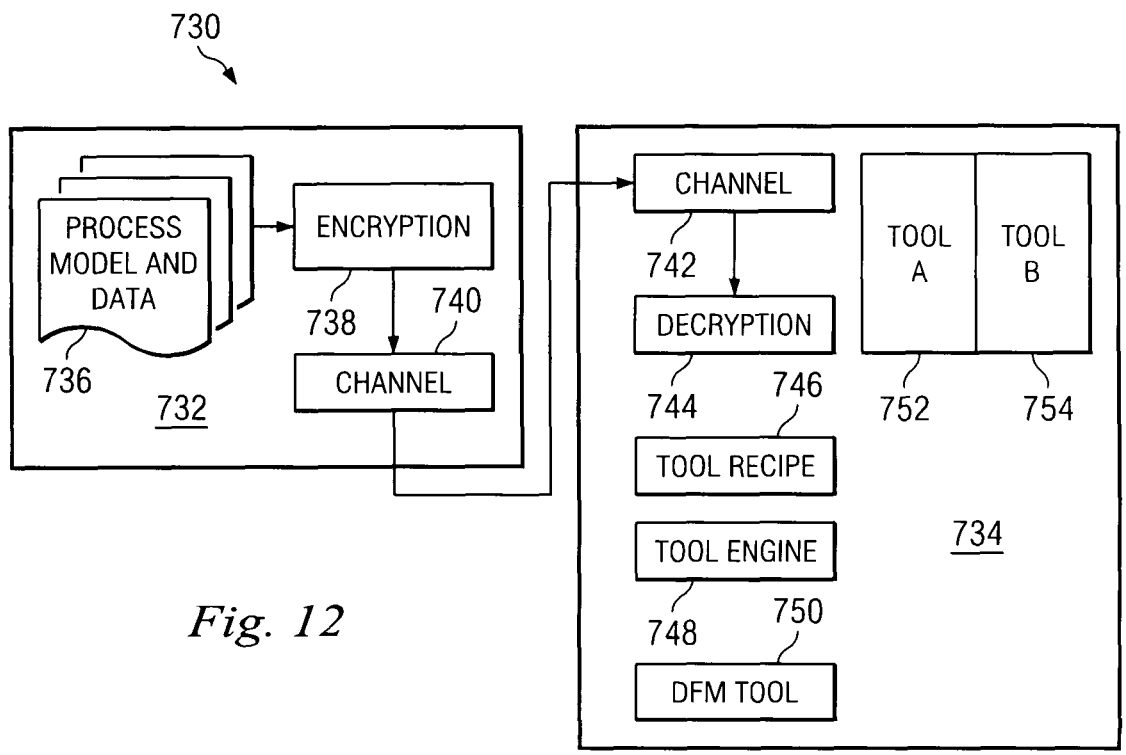
FIG. 12 is a diagrammatic view of an arrangement according to one aspect of the present disclosure that illustrates a communication process between a processing site and a design site.

Referring now to FIG. 12, shown therein is a diagrammatic view of an arrangement 730 that illustrates a communication process between a processing site 732 and a design site 734 as part of at least one of the methods of the present disclosure. As shown, the processing model and accompanying data 736 are encrypted by an encryption key 738 and a communication channel 740 is opened between the processing site 732 and the design site 734. The communication channel 740 of the processing site communicates with a communication channel 742 of the design site 734. This communication process itself may be encrypted or otherwise secured. Further, the communication process may be carried out over any of several types of communication networks, including but not limited to internet, intranet, telecommunication, fiber optic, satellite, and/or other suitable communication network. The processing model and data 736 is received by the design site 734 and decrypted by a decryption key 744. Then the processing model and other data 736 may be communicated to the other components of the design site 734. In the illustrated embodiment, the processing model and data 736 is communicated to a tool recipe 746, a tool engine 748, a DFM tool 750, a tool 752, and a tool 754. In other embodiments, the processing model and data 736 is communicated to more or less components and/or tools of the design site. The design site 734 and its corresponding components may utilize the processing model and data 736 to facilitate the design and layout of devices using the processing parameters stored in the underlying processing model.

Figure 13:
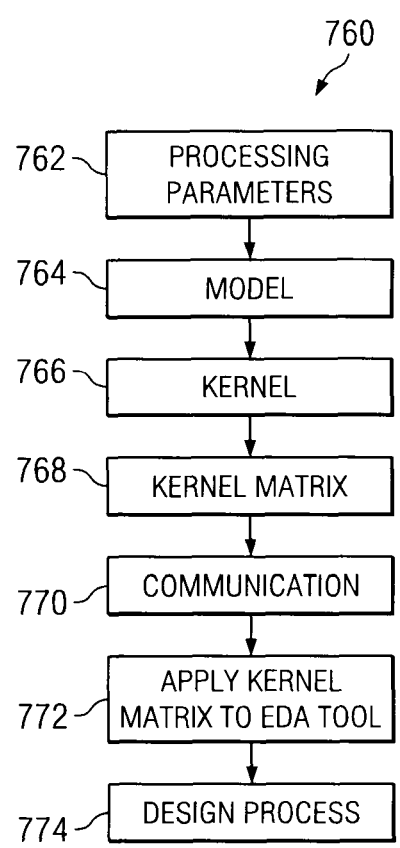
FIG. 13 is a block diagram of an embodiment of a method according to one aspect of the present disclosure for providing a set of processing parameters for use in a design process.

Referring now to FIG. 13, shown therein is a block diagram of an embodiment of a method 760 according to one aspect of the present disclosure for providing a set of processing parameters for use in a design process. The method 760 begins at step 762 where a set of processing parameters are provided. In some embodiments, the set of processing parameters are the processing parameters of a semiconductor fabrication processing facility. After the processing parameters have been provided, the method 760 continues at step 764 with the creation of a model based on the processing parameters. In this regard, in some embodiments the model may be created using a computer system. Thus, in some embodiments the model may be virtual and/or temporary. In some embodiments, the model is stored in a computer readable memory unit for future access. In that regard, in some embodiments the model may be stored in an electronic database. In some embodiments, the model is a universal model in that it may be used by a plurality of vendors and/or EDA tools. In some embodiments, the model is created using known modeling techniques.

The method 760 continues at step 766 with the conversion of the model into a kernel form. The model may be converted into any number of kernels. In some embodiments, the model is converted into a single kernel. In other embodiments, the model is converted into two or more kernels. Each of the plurality of kernels may correspond to different aspects of the processing model and/or the aspects may overlap between kernels. Where the model is converted into two or more kernels, each of the kernels may be configured for individual use and/or configured for combined use with the other kernels. In some embodiments, the kernels are two dimensional. In some embodiments, the kernels are three or more dimensional.

The method 760 continues with step 768 in which the kernel(s) is (are) converted into a matrix format. In some embodiments, the kernels are two dimensional and the resulting matrix and/or matrices are two dimensional. In some embodiments, the kernels are three or more dimensional and the resulting matrix are and/or matrices are three or more dimensional. For example, as previously noted FIGS. 10A and 10B are examples of matrices 713, 714 based on processing model kernels according to one embodiment of the present disclosure. Referring again to FIG. 13, the method 760 continues with step 770 in which the matrix format of the model is then communicated to a design site or facility. In some embodiments, the communication process is encrypted or otherwise secured. Further, the communication process may be carried out over any of several types of communication networks, including but not limited to internet, intranet, telecommunication, fiber optic, satellite, and/or other suitable communication network. In some embodiments, the communication process is carried out by sending a physical object containing the matrix, such as a computer readable media (e.g. cd, dvd, flash drive, or other storage media), to the design site. Further, in some embodiments additional information and/or processing parameters are exported along with the matrix. In some embodiments, the kernels and any relevant coefficients for related calculations are provided to the user/design facility.

After the design facility has received the matrix and any related data, the method 760 continues at step 772 in which the processing parameters imbedded in the matrix are applied to an EDA tool or set of EDA tools used by the design site. In some embodiments, a single universal matrix will be configured for use with a plurality of the EDA tools. The method 760 continues at step 774 in which the design process takes place. With the processing parameters applied to the EDA tools, in some embodiments the design site can detect potential hot spots and other layout problems that may arise during the manufacturing stages and correct them during the design process. The design facility may utilize the processing parameters imbedded in the matrix to design devices based on the specific processing parameters of the fabrication facility from which the matrix model is based. After the design process is complete, the design may be communicated to the processing facility for manufacturing.

Referring now to FIG. 14, shown therein is one embodiment of a file format 800 for importing a layout model for use with an EDA tool according to one aspect of the present disclosure. A plurality of lines 802-826 are included in the file format 800. The line 802 shows the keyword "VERSION" followed by a descriptor, which is "0.1" in the illustrated embodiment. The line 802 describes the version of the import format being used. The line 804 shows the keyword "MASKFIELD" followed by a descriptor, which is "clear" in the illustrated embodiment. The line 804 describes the mask field. The line 806 shows the keyword "MAXR" followed by a descriptor, which is "137" in the illustrated embodiment. "MAXR" in this embodiment means the radius of a matrix A(x,y). In the current embodiment, each kernel of the model will be represented by a matrix with the size of N×N, where N=(1+2*MAXR). The line 808 shows the keyword "DOMAINSIZE" followed by a descriptor, which is "2.000000e−006" in the illustrated embodiment. In the current embodiment, "DOMAINSIZE" represents the full-width ambit. Thus, in the current embodiment "DOMAINSIZE"=2*ambit, the range of the X coordinate is [−ambit, ambit], and the range of coordinate y is [−ambit, ambit].

The line 810 shows the keyword "FORMAT" followed by a descriptor, which is "spatial" in the current embodiment. "FORMAT" in this embodiment indicates whether the kernel matrix of the model is in a spatial domain, a frequency domain, or other domain. The line 812 shows the keyword "BiKER_NUM" followed by a descriptor, which is "20" in the illustrated embodiment. "BiKER_NUM" in this embodiment is the number of the bilinear kernals. Similarly, the line 814 shows the keyword "LiKER_NUM" followed by a descriptor, which is "4" in the illustrated embodiment. "LiKER_NUM" in this embodiment is the number of the linear kernels. In the lines 816-826 the numbers of the kernels are presented in complex value with scientific notation. In the illustrated embodiment, the real part and the imaginary part of each number are separated by a comma. A complete kernel matrix is placed between the keyword BEGIN and END line by line, as shown. Each line of the kernel matrix in this arrangement gives a complex value for a corresponding coordinate. In the current embodiment, the numbers of the first bilinear kernel (K01) are presented between lines 816 and 818. Then the numbers of the second bilinear kernel (K02) are presented between lines 820 and 822. After all of the bilinear kernel numbers have been presented, the numbers of the linear kernels are presented. Thus, the numbers of the first linear kernel (L01) are presented between lines 824 and 826. This process would continue until the numbers of all of the linear kernels have been presented. In the current embodiment, the output sequence of the A(x,y) shows y-directional change first, and the y values are increased gradually. Therefore, the coordinates of the fist N lines are [−ambit, −ambit] to [−ambit, ambit] with a corresponding increase by the step size of delta in the y coordinates. The delta in the current embodiment is the mesh grid interval. The coordinates of the last N lines are [ambit, −ambit] to [ambit, ambit] with a similar step size of delta. As noted above, the following equation may be used to calculate image intensity:

$$I(x, y) = \sum_i |BK_i(x, y) \otimes M(x, y)|^2 + \sum_j LK_j(x, y) \otimes M_b(x, y).$$

FIG. 10B is one embodiment of the resulting 2-D matrix from a kernel according to the present disclosure. FIG. 15 is the 1-D representation 830 of a kernel imported using a file format similar to that described with respect to FIG. 14.

It is to be understood that this simply an exemplary file format and should not be considered limiting as to the organization and/or file type used for importing a model according to aspects of the present disclosure. Numerous other file formats may be used that vary the type of information and number of lines without departing from the spirit of the present disclosure. Further, it is understood that the methods described above may include fewer or additional steps than those recited. Also, the steps recited need not necessarily be performed in a specific order. Any order of steps recited is simply for exemplary purposes and should not be considered limiting.

In some embodiments, the present disclosure is directed towards a system and method for rerouting a circuit design in an effort to avoid any hot spots of a semiconductor device identified by the LPC. The system and method may be adapted to reduce the cost and time required to produce a semiconductor device with the desired properties by identifying and correcting any potential hot spots during the design and simulation phases, rather than after wafer processing. Some embodiments of the system and method are for use in design for manufacture (DFM) applications. Some embodiments of the system and method are utilized in a router or routing system.

In some embodiments the present disclosure corrects LPC detected hot spots within local regions of a device layout. Correcting hot spots by separating a semiconductor layout into a plurality of local regions can increase the processing speed and reduce the required computer processing and memory power necessary for the elimination of hot spots from the entire design layout. Then by correcting the hot spots of each of the local regions, the hot spots of the global design layout are also remedied. In some embodiments, the present disclosure corrects hot spots on the global design layout level. In some embodiments, the present disclosure corrects hot spots on both local regions and the global design layout. Exemplary embodiments of methods for correcting hot spots will now be described. These exemplary embodiments illustrate several possible ways of modifying a design layout to correct detected hot spots after LPC simulation, but should not be considered limiting. Rather, any suitable methods of modifying the design layout to correct any detected hot spots are contemplated as being suitable for use with the LPC simulation to correct hot spots of the device layout.

Figure 16:
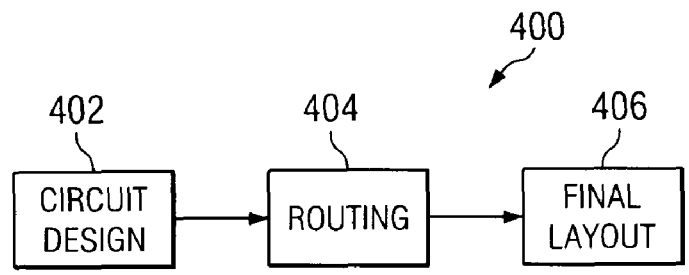
FIG. 16 is a block diagram of an embodiment of a method according to one aspect of the present disclosure for detecting and correcting hot spots of a semiconductor device.

FIG. 16 is a block diagram of an embodiment of a method 400 according to one aspect of the present disclosure for creating a final layout from a circuit design. In particular, the method 400 begins at step 402 where a circuit design is provided. The method 400 continues at step 404 with the routing of the circuit design by a router. As with other embodiments of the present disclosure, the circuit design is often provided in a computer aided design format, such as GDS II for example. As described more fully below, the routing of the circuit design is performed in such a way as to greatly reduce and/or eliminate the existence of any hot spots on the final circuit design layout. The method 400 concludes at step 406 with the output of a final layout of the circuit design taking into account any corrections and/or changes made during the routing process to avoid the presence of hot spots.

Figure 17:
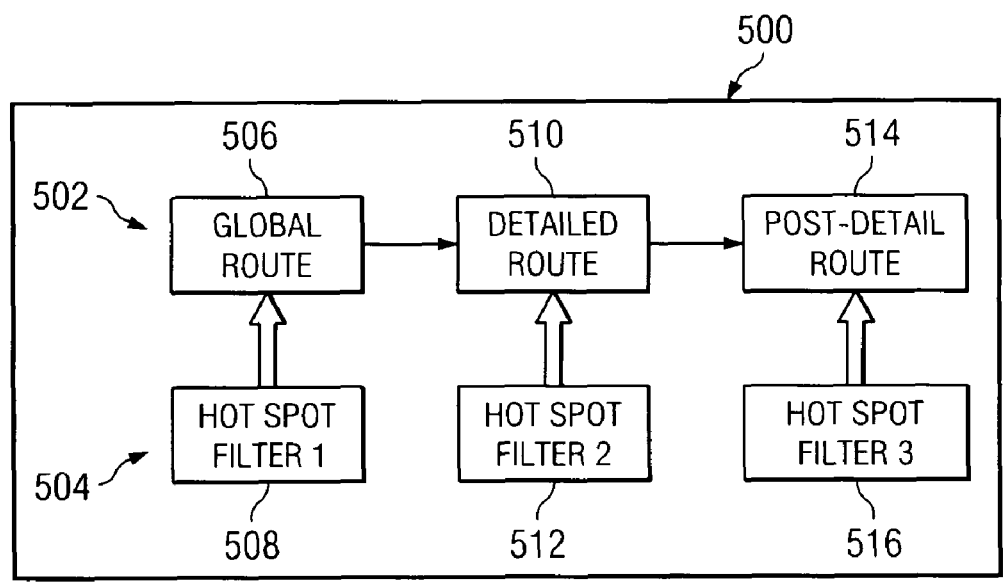
FIG. 17 is a block diagram of an exemplary embodiment of a method similar to the method of FIG. 16.

FIG. 17 is a block diagram of an embodiment of a method of performing the routing step 404 of the method 400 of FIG. 16. The method 500 according to this aspect of the present disclosure is for routing the design layout of a semiconductor device to avoid hot spots. The method 500 includes a routing process 502 and a hot spot filtering process 504. Each of the steps of the routing process 502 is subjected to a corresponding hot spot filter of the hot spot filtering process 504. Step 506 of the routing process is a global or chip-wide routing. Step 506 provides the general layout for the device from which all modifications will be made. A first hot spot filter 508 from the filtering process 504 is applied to step 506. The first hot spot filter 508 defines a first set of hot spot rules that the global routing must comply with. The specific rules of the hot spot filter 508 may be selected based on the desired design layout, the features sizes, the processing techniques, the desired properties (e.g., timing), and/or any other features of the device or manufacturing process.

In at least one embodiment, the first hot spot filter 508 is the most pessimistic of all of the hot spot filters. For example, the hot spot filter 508 may assume that where the global routing could route the lines, vias, layers, or other features in such a way to create a hot spot, that the global routing will route the lines, vias, layers, or other features in that way. Thus, when the global routing provides such a suggested route, the hot spot filter 508 would detect the potential hot spot and communicate to the router to use an alternative route. The hot spot filter 508 may analyze the suggested global layout both sequentially (one line, via, layer, or other feature at a time) and concurrently (considering multiple lines, vias, layers, or other features simultaneously). The first hot spot filter 508 also focuses on optimizing the objectives of the device. For example, the hot spot filter 508 may monitor that timing of sequential events is within the desired range. Where the objectives of the device are not being met, the hot spot filter 508 will communicate to the router to use an alternative route. In some embodiments, the hot spot filter 508 itself is adapted to reroute the device layout to correspond with its rules.

The routing process 502 continues with step 510. Step 510 is a detailed routing that provides an initial detailed layout for the device, including the proposed locations of all lines, vias, layers, and other features. A second hot spot filter 512 from the filtering process 504 is applied to step 510. The second hot spot filter 512 defines a second set of hot spot rules that the detailed routing must comply with. In some embodiments, the second hot spot filter is less pessimistic than the first hot spot filter 508 and provides a more accurate analysis of where hot spots are likely based on the layout. In some embodiments, the second hot spot filter considers each line, via, layer, or feature of the layout sequentially in an effort to detect potential hot spots. Again, the hot spot filter 512 will communicate to the router to use an alternative route and/or reroute the device layout itself to correspond when its hot spot rules are violated.

The routing process 502 continues with step 514. Step 514 is a post-detailed routing that provides the detailed layout for the device after modification based on the second hot spot filter. While the vast majority of hot spots will be detected and eliminated after the global and detailed routing have been subjected to the first and second hot spot filters, some hot spots may still exist due to the specific layout. Thus, a third hot spot filter 516 from the filtering process 504 is applied to step 514. The third hot spot filter 514 defines a third set of hot spot rules that the post-detailed routing must comply with. In some embodiments, the third hot spot filter is less pessimistic and more realistic in its rules than both the first and second hot spot filters. In that regard, in some embodiments the hot spot filter includes a hot spot detector adapted to detect only existing hot spots not simply potential hot spots. Any portions of the layout that violate the rules of the third hot spot filter will be subjected to rerouting. In some embodiments, this reroute is performed manually by a rip-up and re-route technique. In other embodiments, the reroute is again performed by the routing system and/or the hot spot filter. The rerouting may be based on hot spot rules of the third hot spot filter and/or based on more stringent hot spot design rules. After this rerouting all of the hot spots should be eliminated from the device layout. The hotspot-free layout is the final layout.

Though the hot spot filters have been described as having different rules/definitions, in other embodiments the same hot spot filter may be used at. Further, the particular hot spot filter used for a certain step of the routing process may be selected based on the design layout, the features sizes, the processing techniques, or other reasons. A plurality of hot spot filter definitions may be stored in a database for use in the method. In some embodiments, a step of the routing process may not be subjected to hot spot filtering. Further, in other embodiments the routing process 502 may include additional or fewer steps.

Figure 18:
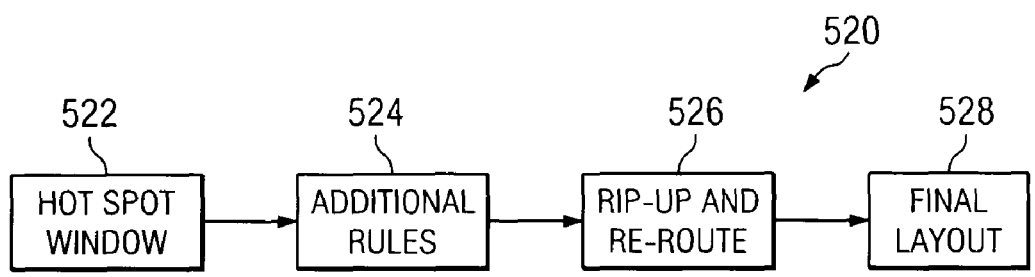
FIG. 18 is a block diagram of an embodiment of a method according to one aspect of the present disclosure for modifying a circuit design to create a final layout.

FIG. 18 is a block diagram of an embodiment of a method 520 according to one aspect of the present disclosure for modifying a circuit design to create a hotspot-free final layout. In some embodiments, the method 520 may be used as part of the rerouting process associated with the third hot spot filter 516 in the method 500 above. Similarly, in some embodiments the method 520 is used as part of the modification process of any of the hot spot filters.

The method 520 begins with step 522 where a hot spot window is defined. The hot spot window is an area surrounding a potential or detected hot spot. The size of the hot spot window will vary depending on the nature of the hot spot detected. In most cases, the hot spot window is of sufficient size to include all of the affected lines, vias, and features that attribute to the hot spot. Once the hot spot window has been defined at step 522, the method 520 continues with step 524 where a set of additional hot spot rules are applied to the hot spot window. In some embodiments, the additional hot spot rules are more stringent than previously applied hot spot rules. Then based on the additional hot spot rules, the method 520 continues to step 526 with the rip-up and rerouting of the affected lines, vias, and other features within the hot spot window.

The rip-up and rerouting is limited to the hot spot window to avoid the potential creation of hot spots in other areas of the device layout outside of the hot spot window. In that regard, in some embodiments the additional hot spot rules prevent any vias from being moved, requiring other modifications to avoid the hot spot problems. In other embodiments, the additional hot spot rules will allow a via to be moved, but only if it can be moved such that no other layers are affected and/or need to be rerouted due to moving the via. In some embodiments, the hot spot rules will define a routing blockage adjacent the predicted or detected hot spot. The routing blockage may have a fixed or configurable size. The size of the routing blockage may be adapted for the size and/or location of the hot spot. Any wire or feature must be rerouted around the blockage in an effort to eliminate the hot spot. After the rip-up and rerouting, any previously existing or detected hot spots should be eliminated. If multiple hot spots were detected in different areas of the device, then multiple hot spot windows will be defined and the lines, vias, and features of each hot spot window will be subjected to the rip-up and reroute to eliminate any hot spot issues. Once all of the hot spot windows have been ripped-up and rerouted, the method 520 continues to step 528 where the final layout is output.

Figure 19:
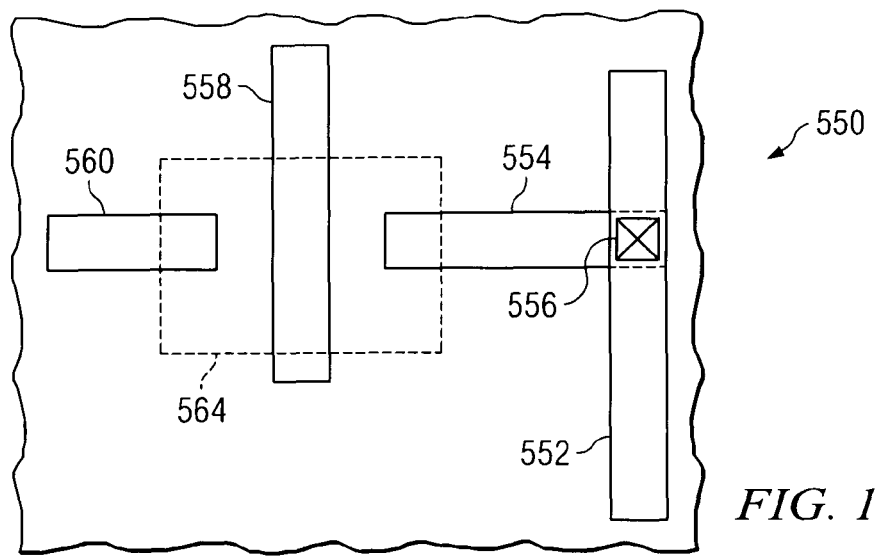
FIG. 19 is a top-down view of a portion of a semiconductor wafer.
Figure 20:
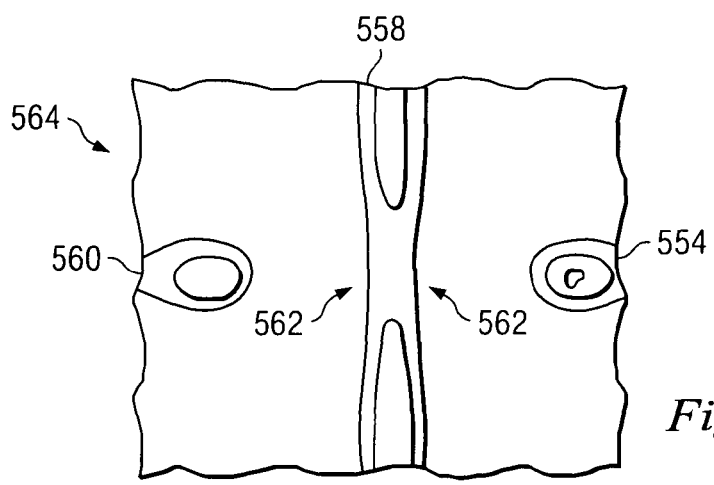
FIG. 20 is an alternative top-down view of a section of the portion of the semiconductor of FIG. 19.

FIGS. 19 and 20 are top-down views of a portion of a semiconductor wafer 550 subject to at least one of the methods described above. As shown, the portion 550 includes a wire 552 and a wire 554. A via 556 connects the wire 552 to the wire 554. The portion 550 also includes a wire 558 spaced from and extending substantially perpendicular to wire 554. The portion 550 also includes a wire 560 spaced from and extending substantially perpendicular to wire 558. In the current embodiment, the wire 560 is substantially parallel and aligned with the wire 554. As shown more clearly in FIG. 20, the routing of the wires 554, 558, 560 results in a hot spot 562. The hot spot 562 is shown as a pinching effect, but in other instances may be any other type of hot spot. Referring again to both FIGS. 19 and 20, a hot spot window 564 is defined around the hot spot 562. In some embodiments, the wires 554, 558, and 560 are then ripped up and rerouted within the hot spot window 564, for example as described in method 520 above.

Figure 21:
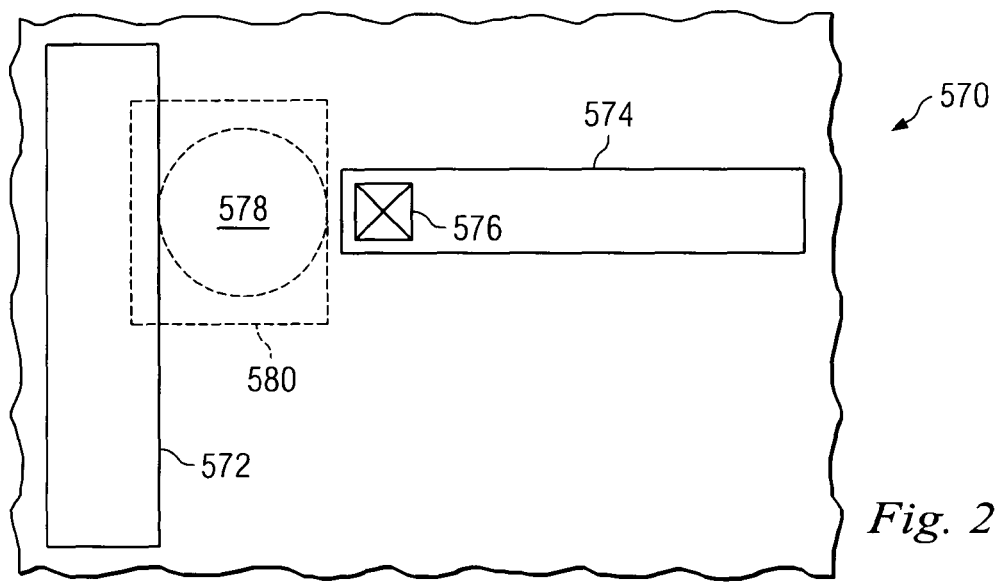
FIG. 21 is a top-down view of a portion of a semiconductor wafer.
Figure 22:
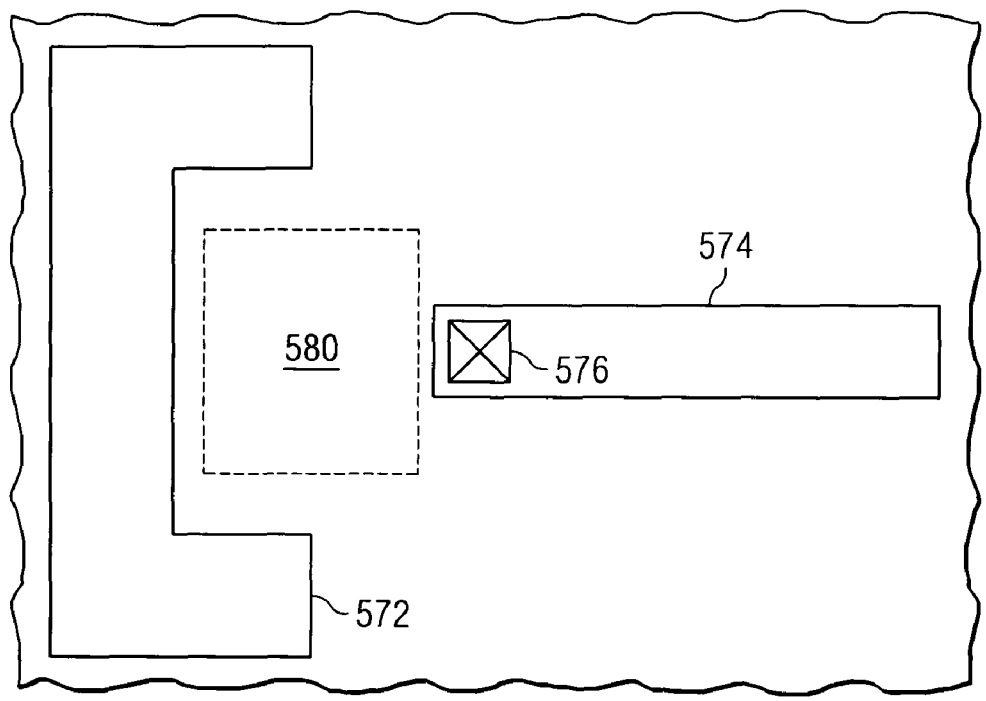
FIG. 22 is a top-down view of the portion of the semiconductor wafer of FIG. 21 after rerouting according to a method of one aspect of the present disclosure.

FIGS. 21 and 22 are top-down views of a portion of a semiconductor wafer 570 subject to at least one of the methods described above. FIG. 22 shows the portion of the semiconductor wafer 570 after rerouting according to one of the methods described above. As shown in FIG. 21, the portion 570 includes a wire 572 and a wire 574. A via 576 connects the wire 552 to the other wires (not shown). As shown, the routing of the wires 572, 574 results in a hot spot 578. The hot spot 578 is shown generally and may represent any type of hot spot. A hot spot blockage 580 is defined around the hot spot 578. In some embodiments, the wire 572 is then ripped up and rerouted to avoid the hot spot blockage 580, as shown in FIG. 22 and described above with respect to method 520.

Figure 23:
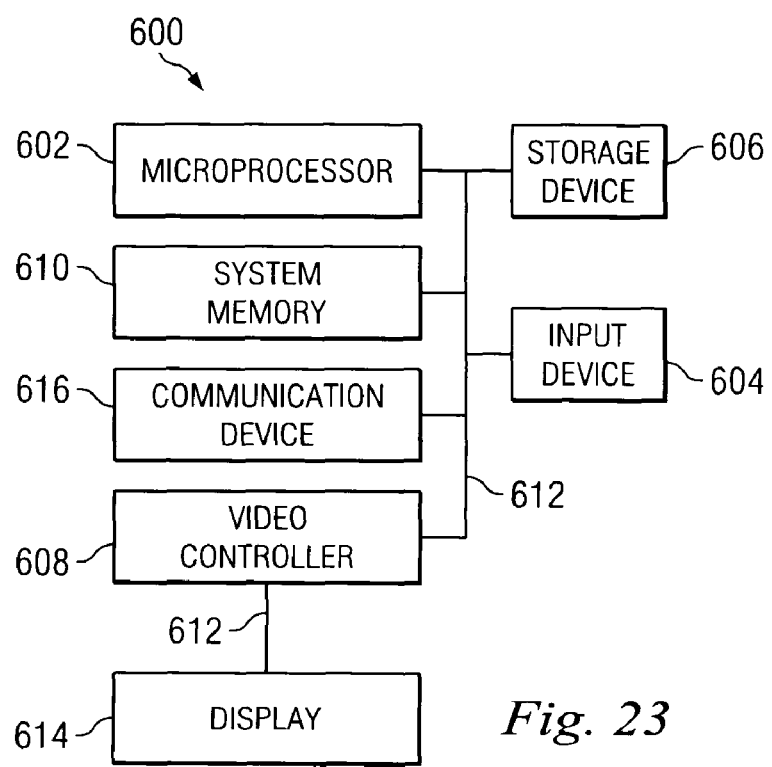
FIG. 23 is a diagrammatic view of a node for implementing various embodiments of the methods of the present disclosure.

Referring now to FIG. 23, shown therein is an illustrative node 600 for implementing embodiments of the methods described above. Node 600 includes a microprocessor 602, an input device 604, a storage device 606, a video controller 608, a system memory 610, and a display 614, and a communication device 616 all interconnected by one or more buses 612. The storage device 606 could be a floppy drive, hard drive, CD-ROM, optical drive, or any other form of storage device. In addition, the storage device 606 may be capable of receiving a floppy disk, CD-ROM, DVD-ROM, or any other form of computer-readable medium that may contain computer-executable instructions. Further communication device 616 could be a modem, network card, or any other device to enable the node to communicate with other nodes. It is understood that any node could represent a plurality of interconnected (whether by intranet or Internet) computer systems, including without limitation, personal computers, mainframes, PDAs, and cell phones.

A computer system typically includes at least hardware capable of executing machine readable instructions, as well as the software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, personal digital assistants (PDAs), or personal computing devices (PCDs), for example). Further, hardware may include any physical device that is capable of storing machine-readable instructions, such as memory or other data storage devices. Other forms of hardware include hardware sub-systems, including transfer devices such as modems, modem cards, ports, and port cards, for example.

Software includes any machine code stored in any memory medium, such as RAM or ROM, and machine code stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, it should be understood that combinations of hardware and software are also included within the definition of a computer system and are thus envisioned by the present disclosure as possible equivalent structures and equivalent methods.

Computer-readable mediums include passive data storage, such as a random access memory (RAM) as well as semi-permanent data storage such as a compact disk read only memory (CD-ROM). In addition, an embodiment of the present disclosure may be embodied in the RAM of a computer to transform a standard computer into a new specific computing machine.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The system may be designed to work on any specific architecture. For example, the system may be executed on a single computer, local area networks, client-server networks, wide area networks, internets, hand-held and other portable and wireless devices and networks.

A database may be any standard or proprietary database software, such as Oracle, Microsoft Access, SyBase, or DBase II, for example. The database may have fields, records, data, and other database elements that may be associated through database specific software. Additionally, data may be mapped. Mapping is the process of associating one data entry with another data entry. For example, the data contained in the location of a character file can be mapped to a field in a second table. The physical location of the database is not limiting, and the database may be distributed. For example, the database may exist remotely from the server, and run on a separate platform. Further, the database may be accessible across the Internet. Note that more than one database may be implemented.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood that various different combinations of the above-listed processing steps can be used in combination or in parallel. Also, features illustrated and discussed above with respect to some embodiments can be combined with features illustrated and discussed above with respect to other embodiments. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for providing semiconductor fabrication processing parameters to a design facility, the method comprising:

using a processor for:

providing a set of processing parameters of a fabrication facility;

creating a model from the set of processing parameters, the model being in the form of electronic data;

converting the model into a corresponding set of one or more kernels;

converting the set of kernels into a corresponding set of one or more matrices; and communicating the set of matrices to the design facility; whereby the set of matrices are utilized by the design facility in a design process.

2. The method of claim 1, further comprising: applying the set of matrices to an electronic design automation ("EDA") tool of the design facility.

3. The method of claim 2, wherein the set of matrices is configured for use with a plurality of EDA tools.

4. The method of claim 3, further comprising: applying the set of matrices to at least two EDA tools.

5. The method of claim 2, further comprising: detecting hot spots in a design layout using the EDA tool of the design facility; and correcting any detected hot spots.

6. The method of claim 2, wherein each matrix of the set of matrices is at least two-dimensional.

7. The method of claim 1, wherein each of the kernels of the set of kernels is at least two-dimensional.

8. The method of claim 1, wherein the set of matrices cannot be reversed to extract the processing parameters.

9. The method of claim 1, wherein set of matrices are communicated to the design facility over a computer network.

10. In a data processing system, a method for providing semiconductor fabrication processing parameters to a design facility, the method comprising:
providing a set of semiconductor processing parameters from a fabrication facility to an input of a processor;
the processor establishing a processing model based on the set of semiconductor processing parameters;
the processor converting the processing model into a set of kernels; and
an output of the processor sending the set of kernels to the design facility in a format that can be used with an electronic design automation (EDA) tool.

11. The method of claim 10, wherein the sending includes:
extracting a set of matrices from the set of kernels; and
sending the set of matrices to the design facility.

12. The method of claim 10, further comprising providing a set of hot spot detection rules and a set of hot spot correction rules based on the set of semiconductor processing parameters for use by the EDA tool.

13. The method of claim 12, further comprising communicating the set of hot spot detection rules and the set of hot spot correction rules to the design facility.

14. The method of claim 13, further comprising designing a semiconductor chip layout using the EDA tool, the hot spot detection rules, and the hot spot correction rules.

15. The method of claim 10, wherein the sending is carried out in a manner so that the set of kernels have a format that can be used with additional EDA tools from additional design facilities.

16. The method of claim 10, further comprising sending the set of kernels to a plurality of design facilities over a computer network.

17. In a data processing system, a method for providing semiconductor fabrication processing parameters to a design entity, the method comprising:
providing a set of processing parameters from a fabrication entity to an input of a processor;
the processor creating a model from the set of semiconductor processing parameters;
the processor converting the processing model into a set of two-dimensional kernels;
the processor converting the set of two-dimensional kernels into a set of matrices, the set of matrices being in a format recognizable by an electronic design automation (EDA) tool; and
an output of the processor communicating the set of matrices to the design entity.

18. The method of claim 17, further comprising:
generating a set of hot spot detection rules and a set of hot spot correction rules in response to the processing parameters; and
communicating the set of hot spot detection rules and the set of hot spot correction rules to the design entity, wherein the design entity is remotely positioned from the fabrication entity.

19. The method of claim 18, further comprising generating a semiconductor chip layout in response to the set of matrices, the set of hot spot detection rules, and the set of hot spot correction rules.

20. The method of claim 17, further comprising applying the set of matrices to at least two different EDA tools.

* * * * *